United States Patent [19]
Schrittesser

[11] Patent Number: 5,675,289
[45] Date of Patent: Oct. 7, 1997

[54] DIFFERENTIAL AMPLIFIER

[75] Inventor: Gerold Schrittesser, Villach, Austria

[73] Assignee: Siemens Aktiengesellschaft, Munich, Germany

[21] Appl. No.: 594,950

[22] Filed: Jan. 31, 1996

[30] Foreign Application Priority Data

Jan. 31, 1995 [DE] Germany .................. 195 03 036.2

[51] Int. Cl.⁶ .................................. H03F 3/45; H03F 3/16
[52] U.S. Cl. .................................. 330/253; 330/257
[58] Field of Search .................. 330/253, 257, 330/277, 295, 300

[56] References Cited

U.S. PATENT DOCUMENTS 3,970,950  7/1976  Freeman et al. ............... 330/253
5,210,236  5/1993  Takaganagi .................... 330/253

*Primary Examiner*—Steven Mottola
*Attorney, Agent, or Firm*—Herbert L. Lerner; Laurence A. Greenberg

[57] ABSTRACT

A differential amplifier includes two differential amplifier stages each having an input side with two complementary inputs and an output side with at least one output. The stages are connected parallel to one another on the input and output sides. The stages each include a source-coupled transistor pair. One of the transistor pairs has two depletion MOS field effect transistors of a given conduction type and the other of the transistor pairs has two enhancement MOS field effect transistors of the given conduction type. Current sources each supply a respective one of the transistor pairs.

8 Claims, 2 Drawing Sheets

DIFFERENTIAL AMPLIFIER

BACKGROUND OF THE INVENTION

Field of the Invention

The invention relates to a differential amplifier including two differential amplifier stages each having two complementary inputs and at least one output, the stages being connected parallel to one another on the input and output sides and each including a source-coupled transistor pair supplied from a respective current source.

One such circuit is known, for instance, from the book entitled: Electronic Circuits—Design and Applications, by U. Tietze and C. Schenk, Springer-Verlag, Berlin, Heidelberg 1991, p. 446f. The two pairs of transistors each include transistors of one generic type but of a different conduction type. That is, there are two complementary, otherwise substantially identical differential amplifier stages, which are connected parallel to one another on the input side and the output side. Due to the complementary structure of the differential amplifier, among other accomplishments, the relatively small input voltage range of conventional differential amplifiers extends virtually as far as the limits specified by the supply voltages. However, in the known circuit it is problematic to achieve a mutually tuned direct current adjustment of the two differential amplifier stages.

In order to achieve symmetry of the two complementary differential amplifier stages, considerable additional expense is usually necessary.

SUMMARY OF THE INVENTION

It is accordingly an object of the invention to provide a differential amplifier, which overcomes the hereinafore-mentioned disadvantages of the heretofore-known devices of this general type and which has an expanded input voltage range.

With the foregoing and other objects in view there is provided, in accordance with the invention, a differential amplifier, comprising two differential amplifier stages each having an input side with two complementary inputs and an output side with at least one output, the stages being connected parallel to one another on the input and output sides, the stages each including a source-coupled transistor pair, one of the transistor pairs having two depletion MOS field effect transistors of a given conduction type, the other of the transistor pairs having two enhancement MOS field effect transistors of the given conduction type, and current sources each supplying a respective one of the transistor pairs.

In accordance with another feature of the invention, the two differential amplifier stages each have two complementary outputs, which are formed by the drain terminals of the transistors of the respective transistor pairs, and the outputs of the two differential amplifier stages, which outputs are connected to one another for the sake of a parallel circuit, are each terminated by a common load. An advantage in this case is the extremely slight expenditure for circuitry.

In accordance with a further feature of the invention, the two common loads are formed by an input branch and output branch of a current mirror circuit.

In accordance with an added feature of the invention, the two differential amplifier stages each have at least one output, which is formed by the source terminal of a further transistor being operated as an emitter follower. Moreover, the two further transistors have gate terminals which are each connected to the drain terminals of two corresponding transistors, one from each transistor pair. The drain terminals of the transistors of both transistor pairs are each terminated by a respective load. The advantage in this case is that the input voltage range is further increased as compared with the first embodiment mentioned above.

In accordance with an additional feature of the invention, in the second embodiment, the two loads each terminating one transistor pair are formed, in both transistor pairs, by the input branch and output branch of a respective current mirror circuit.

In accordance with yet another feature of the invention, there is provided one resistor being connected parallel to each of the loads of the respective enhancement field effect transistors, having drain terminals which are connected to emitter followers. This advantageously prevents the high-impedance input of the particular output-side emitter follower from being able to assume undefined voltage states.

In accordance with a concomitant feature of the invention, the source terminals, which are connected to one another for the sake of the parallel circuit, of the further transistors being operated as emitter followers, are terminated by a common load, and the common load is formed by a further current source.

Other features which are considered as characteristic for the invention are set forth in the appended claims.

Although the invention is illustrated and described herein as embodied in a differential amplifier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
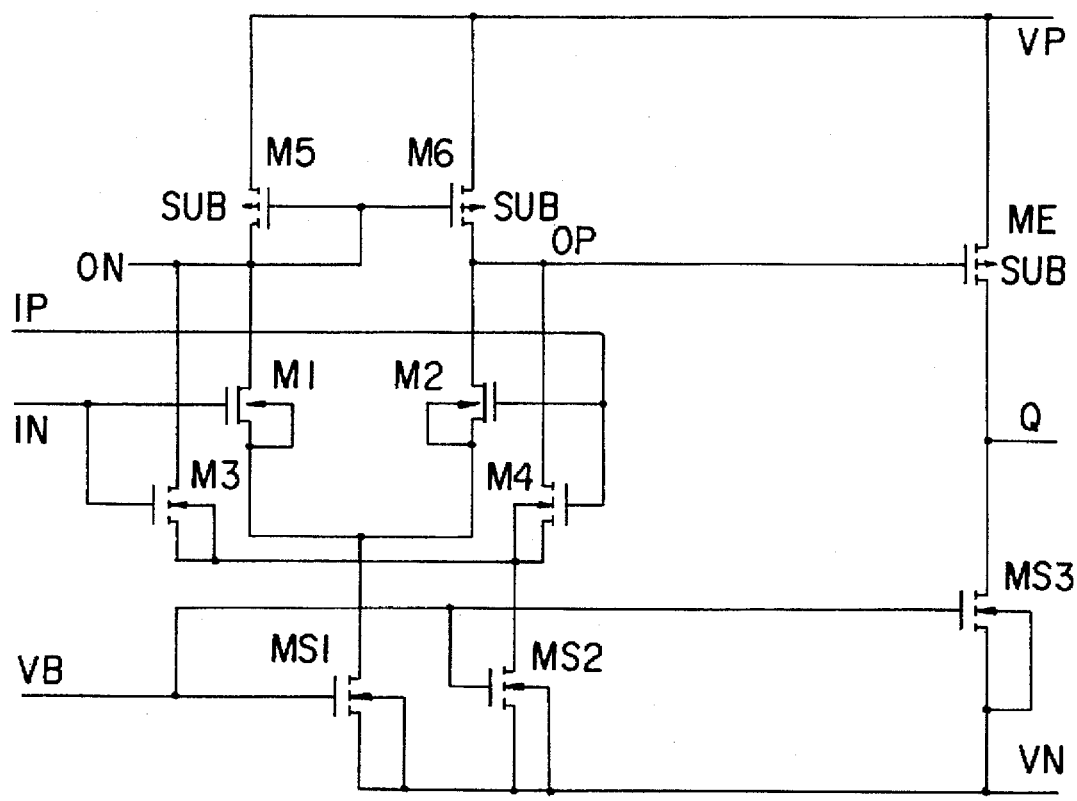
FIG. 1 is a schematic circuit diagram of a first embodiment of a differential amplifier according to the invention.

Referring now to the figures of the drawing in detail and first, particularly, to FIG. 1 thereof, there is seen an exemplary embodiment of the invention having two differential amplifier stages, each of which includes a source-coupled transistor pair supplied from a current source. One transistor pair includes two depletion MOS field-effect transistors M1 and M2, both of which are of the n-channel conduction type. The other transistor pair includes two enhancement MOS field-effect transistors M3, M4, which are also of the n-channel conduction type. A source-to-drain path of a further enhancement MOS field effect transistor MS1 is connected between the coupled source terminals of the two transistors M1 and M2 and a negative supply potential VN. A source-to-drain path of a further enhancement MOS field effect transistor MS2 is connected between the coupled source terminals of the two transistors M3 and M4 and the negative supply potential VN. Both of the MOS field effect transistors MS1 and MS2 are of the n-channel type and a bias potential VB is applied to their gate terminals. The transistors MS1 and MS2, in combination with the bias potential VB, form the current sources that supply the transistor pairs.

The two differential amplifier stages are connected in parallel on the input side in such a way that the gate terminals of the transistors M1 and M3 on one hand, and the gate terminals of the transistors M2 and M4 on the other hand, are each interlinked and form respective complementary inputs IN, IP of the differential amplifier.

The outputs of the two differential amplifier stages are connected in parallel by connecting the drain terminals of the transistors M1 and M3 to one another and by connecting the drain terminals of the transistors M2 and M4 to one another. The respective coupled-together drain terminals of the transistors M1–M4 form complementary outputs ON and OP, which are each terminated by a load. Input and output circuits of a current mirror are contemplated as the loads. The input circuit of the current mirror includes an enhancement MOS field effect transistor M5 of the p-channel conduction type, which is wired as a diode by interconnecting its drain and gate terminals. The drain terminal of the transistor M5 is connected to the coupled drain terminals of the transistors M1 and M3 and the source terminal of the transistor M5 is connected to a positive supply potential VP. The output branch of the current mirror includes an enhancement MOS field effect transistor M6 of the p-channel conduction type, having a drain terminal which is coupled to the coupled drain terminals of the transistors M2 and M4, a source terminal which is connected to the positive supply potential VP and a gate terminal which is connected to the gate and source terminals of the transistor M5.

Finally, the output OP is following by an emitter follower for buffering purposes. The emitter follower includes an enhancement MOSFET ME of the p-channel conduction type, having a source terminal which is connected to the positive supply potential VP, a gate terminal which is connected to the output OP and a drain terminal forming a non-complementary output Q, which is coupled through a current source to the negative supply potential VN. The current source is formed by an enhancement MOS field effect transistor MS3 of the n-channel conduction type, having a drain terminal which is connected to the drain terminal of the transistor ME, a source terminal which is connected to the negative supply potential VN and a gate terminal to which the bias potential VB is applied.

Figure 2:
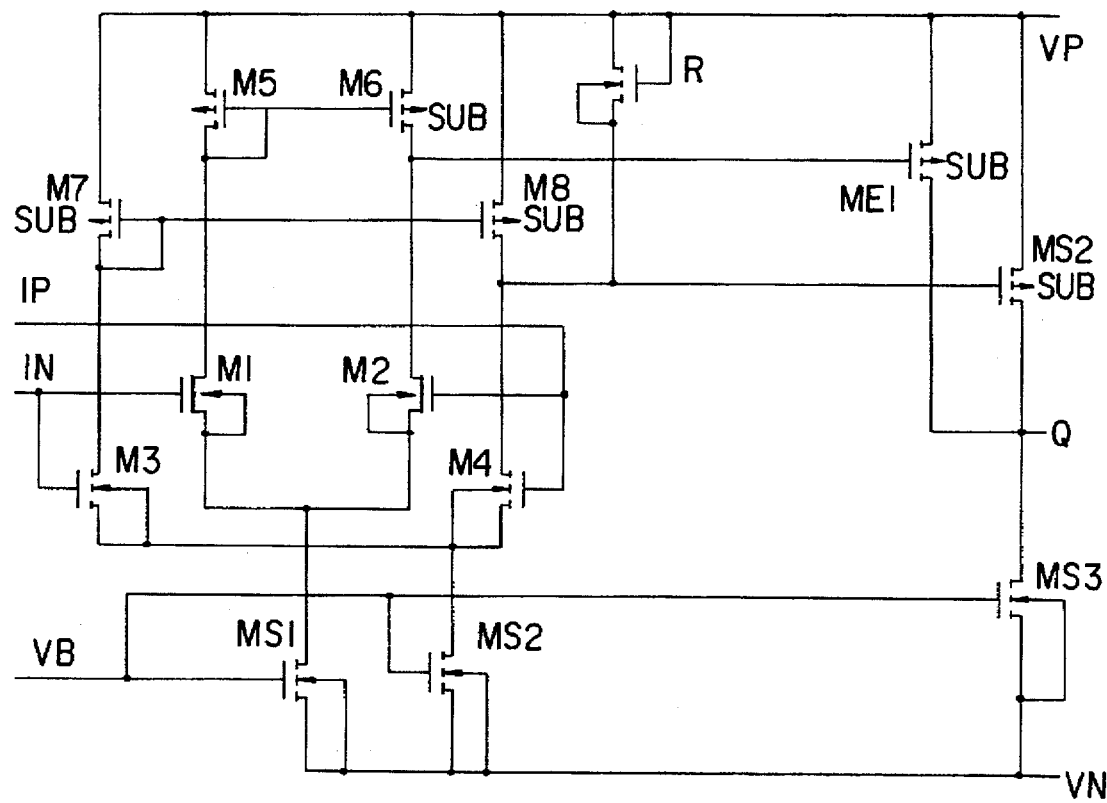
FIG. 2 is a schematic circuit diagram of a second embodiment of a differential amplifier according to the invention.

The differential amplifier of FIG. 2 is modified as compared with that of FIG. 1 in that the drain terminals of the transistors M1–M4 are not connected to one another but rather are each connected through a load to the positive supply potential VP. The loads which are connected to the drain terminals of the transistors M1 and M2 on one hand, and to the drain terminals of the transistors M3 and M4 on the other hand, are each provided by the input and output circuit of one respective current mirror circuit. The current mirror circuits each include a respective enhancement MOS field effect transistor M5 and M7 of the p-channel type and a respective enhancement MOS field-effect transistor M6 and M8 of the p-channel type. The transistors M5 and M7 each have gate and drain terminals that are connected to one another and a source terminal which is connected to the positive supply potential VP. The transistors M6 and M8 each have a source terminal which is connected to the positive supply potential VP and a gate terminal which is connected to the gate and drain terminals of the respective transistors M5 and M7. The drain terminals of the transistors M5 and M6 are connected to the drain terminals of the transistors M1 and M2. The drain terminals of the transistors M7 and M8 are respectively connected to the drain terminals of the transistors M3 and M4.

Each of the drain terminals of the transistors M2 and M4 are moreover connected to the gate terminal of a respective enhancement MOS field effect transistor ME1 and ME2 of the p-channel conduction type, which are in place of the transistor ME of FIG. 1. To that end, in both transistors, the source terminals are connected to the positive supply potential VP and the drain terminals are coupled on one hand to the output Q and on the other hand through the current source to the negative supply potential VN. Finally, a pull-up resistor is provided, which is formed by an enhancement MOS field-effect transistor R of the n-channel type, which is connected on the drain and gate side to the positive supply potential VP and on the source side to the gate terminal of the transistor ME2.

In the event that in addition to the output Q an output which is complementary to it is needed, then the drain terminals of transistors M1 and M3 should also be connected to the gate terminals of the transistors that correspond to the transistors ME1 and ME2. The corresponding transistors should be operated as emitter followers through a corresponding current source, and corresponding pull-up resistors should optionally be provided.

Moreover, in both exemplary embodiments, the well terminals of the transistors M1–M4 and MS1–MS3 are connected to the respective source terminal and the well terminals of transistors M4–M8, ME, ME1 and ME2 are connected to a substrate SUB.

The advantages of a differential amplifier according to the invention are based on the fact that instead of the previously used complementary transistor pairs, in the differential amplifier of the invention one depletion and one enhancement pair of transistors of the same conduction type are combined with one another. In their totality, the two transistor pairs form a "differential-to-single-ended stage", having a direct current adjustment which causes no problems whatever. Due to the different operating voltages of depletion and enhancement transistors, the input voltage range can be expanded to far below the negative supply potential VN and nearly up to the positive supply potential VP.

An embodiment which is provided for this purpose and requires little expenditure for circuitry is shown in FIG. 1. At input potentials near the negative supply potential, the depletion pair of transistors becomes operative, and in the range near the positive supply potential the enhancement pair of transistors becomes operative. In order to assure that the two pairs of transistors will not overly greatly hinder one another in their respective functional ranges, each pair of transistors is provided with its own source of source current.

In the differential amplifier of FIG. 1, the depletion pair of transistors prevents the outputs ON and OP from being modulated into the vicinity of the positive supply potential VP. If the outputs of the depletion and enhancement pairs of transistors are allowed to assume voltage independently of one another, as is the case in the exemplary embodiment of FIG. 2, then the upper limit of the input potential range is even closer to the positive supply potential VP than in the case of the exemplary embodiment of FIG. 1.

It is possible, however, given synchronized modulation with a voltage lower than the operating voltage of the various transistors, that the outputs of the differential amplifier stage with the enhancement transistor pair can assume undefined voltages, which would lead to a malfunction. This problem is overcome by the high-impedance pull-up transistor R, which can be of either the n-channel conduction type or the p-channel conduction type, at the output or outputs of the differential amplifier stage with the enhancement transistor pair.

In closing it should be pointed out that differential amplifier stages according to the invention can be employed both in comparators and in operational amplifiers, and that it is also possible to use resistors, current sources, diodes, and so forth as loads instead of the input and output circuit of a current mirror.

I claim:

1. A differential amplifier, comprising:

two differential amplifier stages each having an input side with two complementary inputs and an output side with at least one output, said stages being connected parallel to one another on said input and output sides, said stages each including a source-coupled transistor pair, one of said transistor pairs having two depletion MOS field effect transistors of a given conduction type, the other of said transistor pairs having two enhancement MOS field effect transistors of said given conduction type, and a plurality of current sources each supplying a respective one of said transistor pairs.

2. The differential amplifier according to claim 1, wherein said at least one output of each of said differential amplifier stages are two complementary outputs of each of said differential amplifier stages, said transistors of said respective transistor pairs have drain terminals forming said complementary outputs, said outputs of said differential amplifier stages are connected to one another in a parallel circuit, and including two common loads each terminating said outputs of a respective one of said differential amplifier stages.

3. The differential amplifier according to claim 2, wherein said two common loads are formed by an input branch and output branch of a current mirror circuit.

4. The differential amplifier according to claim 1, including two further transistors being operated as source followers and having source terminals forming said at least one output of said two differential amplifier stages, said two further transistors having gate terminals each being connected to the drain terminal of a respective one of said transistors of each of said transistor pairs, and respective loads each terminating the drain terminal of a respective one of said transistors of both of said transistor pairs.

5. The differential amplifier according to claim 4, including current mirror circuits each having an input branch and an output branch forming said two loads each terminating one of said transistor pairs.

6. The differential amplifier according to claim 5, including a resistor being connected parallel to each of said loads of said respective enhancement field effect transistors having drain terminals being connected to said source followers.

7. The differential amplifier according to claim 4, wherein the source terminals of said further transistors being operated as source followers are connected in a parallel circuit, and including a common load terminating the source terminals of said further transistors being operated as source followers.

8. The differential amplifier according to claim 7, wherein said common load is formed by a further current source.

* * * * *